US005866911A

United States Patent [19]
Baer

[11] Patent Number: 5,866,911
[45] Date of Patent: Feb. 2, 1999

[54] METHOD AND APPARATUS FOR IMPROVING RESOLUTION IN SCANNED OPTICAL SYSTEM

[76] Inventor: Stephen C. Baer, 10 Poplar Rd., Cambridge, Mass. 02138

[21] Appl. No.: 275,967

[22] Filed: Jul. 15, 1994

[51] Int. Cl.$^6$ .................................................. G01N 21/64
[52] U.S. Cl. .................................. 250/458.1; 250/459.1; 250/461.1; 250/461.2
[58] Field of Search ............................ 250/461.2, 461.1, 250/459.1, 458.1

[56] References Cited

U.S. PATENT DOCUMENTS

| | | | |
|---|---|---|---|
| 3,013,467 | 12/1961 | Minsky | 356/432 |
| 3,513,980 | 5/1970 | Petráň et al. | 210/238 |
| 3,705,755 | 12/1972 | Baer | 359/202 |
| 4,100,571 | 7/1978 | Dykes and Oharek | 358/87 |
| 4,460,828 | 7/1984 | Harvey | 250/329 |
| 4,471,470 | 9/1984 | Swainson et al. | 365/127 |
| 4,917,462 | 4/1990 | Lewis et al. | 359/368 |
| 5,034,613 | 7/1991 | Denk et al. | 250/458.1 |
| 5,153,873 | 10/1992 | Spruit et al. | 369/275.2 |
| 5,268,862 | 12/1993 | Rentzepis | 365/151 |
| 5,289,407 | 2/1994 | Strickler et al. | 365/106 |

FOREIGN PATENT DOCUMENTS

| | | | |
|---|---|---|---|
| 2613845 | 10/1988 | France | 250/461.1 |

OTHER PUBLICATIONS

S. Hell, "Improvement of Lateral Resolution in Far–Field Light Microscopy by Using Two–Photon Excitation with Offset Beams." *Optics Communications,* vol. 106, Amsterdam, The Netherlands, 1994, pp. 19–24.

S. Hell and J. Wichmann, "Breaking the Diffraction Resolution Limit by Stimulated–Emission–Depletion Flourescence Microscopy" *Optics Letters* vol. 19, Washington, U.S.A. 1994, pp. 780–782.

S. Inoué, "Imaging of Unresolved Objects, Superresolution, and Precision of Distance Measurement with Video Microscopy" in Taylor and Wang, *Flourescence Microscopy of Living Cells in Culture, Part B* San Diego, U.S.A. 1989 pp. 85–112. Academic Press, Inc.

Toraldo di Francia, "Super–Gain Antennas and Optical Resolving Power" Nuovo Cimento, Suppl.9, Bologna, Italy, 1952 pp. 426–435.

Fukumoto and Kubota, "Superresolution of Optical Discs Using a Small Aperture," Jpn. J. Appl. Phys. vol. 31, Tokyo, Japan, 1992 pp. 529–533 Feb. Part 1, No. 2B.

Yanagisawa and Ohsawa, "Superresolution in Optical Disc Systems with a Non–Linear Refractive Layer" *Jpn. J. Appl. Phys.* vol. 32, Tokyo, Japan 1993 pp. 1971–1974. May Part 1, No. 5A.

Denk, et al Two–Photon Laser Scanning Fluorescence Microscopy, *Science,* vol. 248, Washington, U.S.A. 1990, pp. 73–76.

Sheppard and Gu, "Image Formation in Two–Photon Fluorescence Microscopy" *Optik* vol. 86, Stuttgart, Germany 1990, pp. 104–106. No. 3.

(List continued on next page.)

*Primary Examiner*—Constantine Hannaher

[57] ABSTRACT

In scanned optical systems such as confocal laser microscopes wherein a beam of light is focused to a spot in a specimen to excite a fluorescent species or other excitable species in the spot, the effective size of the excitation is made smaller than the size of the spot by providing a beam of light of wavelength adapted to quench the excitation of the excitable species, shaping this second beam into a pattern with a central intensity minimum, and overlapping this central minimum with the central intensity maximum of the focused spot, so that within the spot the intensity of quenching light increases with distance from the center of the spot, thereby preferentially quenching excitation in the peripheral parts of the spot, and thereby reducing the effective size of the excitation and thus improving the resolution of the system.

21 Claims, 9 Drawing Sheets

OTHER PUBLICATIONS

Strickler and Webb, Two–Photon Excitation in Laser Scanning Fluorescence Microscopy, Proc. SPIE, vol. 1398, Bellingham, WA, U.S.A. 1990, pp. 107–118.

Parthenopoulos and Rentzepis, "Three–Dimensional Optical Storage Memory" *Science,* vol. 245, Washington, DC, U.S.A., 1989, pp. 843–845.

Hegedus and Sarafis, "Superresolving Filters in Confocally Scanned Imaging Systems", J. Opt. Soc. Am. A, vol. 3, Washington, DC, U.S.A. 1986,pp. 1892–1896.

Arimoto and Kawata, "Laser–Scan Flourescence Microscope with Annular Excitation" *Optik* vol. 86, Stuttgart, Germany, 1990, pp. 7–10. No. 1.

METHOD AND APPARATUS FOR IMPROVING RESOLUTION IN SCANNED OPTICAL SYSTEM

FIELD OF THE INVENTION

The present invention relates to scanned optical systems in which a beam of light is focused to the smallest possible spot in a specimen in order to selectively excite, within the illuminated spot, an excitable species such as a fluorescent dye, and more specifically to a method of improving the resolution of such systems.

BACKGROUND OF THE INVENTION

In many fields of optics, a light beam is focused to the smallest possible spot in a specimen in order to selectively photoexcite a molecular species in the illuminated spot. Such fields include scanned beam fluorescence microscopy, scanned beam microlithography, nanofabrication, and optical digital information storage and retrieval. The lenses in such resolution demanding applications often approach diffraction limited performance, and in view of the dependence of resolution on wavelength and numerical aperture of the objective focusing the light, these lenses are designed with the largest practical numerical apertures and used with light of the shortest practical wavelengths.

Additionally, a variety of techniques have been devised to push resolution beyond the Abbe limit set by diffraction theory (S. Inoué, p. 85 in D. L. Taylor and Yu-li Wang, Fluorescence Microscopy of Living Cells in Culture, Part B, Academic Press, 1989). These techniques include placing annular and multiannular apertures in the aperture plane of the objective (Toraldo di Francia, Nuovo Cimento, Suppl. 9:426 (1952)) and using scanned confocal optics (M. Minsky, U.S. Pat. No. 3,013,467 (1961)). While in theory, such aperture plane apertures can allow arbitrarily narrow central maxima of the point spread function, any substantial narrowing of the central maximum is accompanied by dramatically less efficient light utilization and degraded image contrast. Although, as originally pointed out by the inventor of the present invention (Baer, U.S. Pat. No. 3,705,755 (1972)), this problem of degraded contrast can be reduced by the use of such aperture plane apertures in a confocal scanning system, such a solution does nothing to improve the inefficient use of light actually reaching the specimen, so that in practice, light induced damage of the specimen or photobleaching of the fluorescent dye could limit the usefulness of such an approach. The technique of scanned probe, near field microscopy (Lewis et al U.S. Pat. No. 4,917,462) has had more success in achieving high resolution, but this technique is limited to the exposed surface of flat specimens. A related technique applicable only in the special case of optical disc recording and playback, involves the deposition, adjacent to the information containing layer, of an opaque layer which is be made to undergo a change an optical property such as transparency by a focused beam (Fukumoto and Kubota, Jpn. J. Appl. Phys. 31:529 (1992) Yanagisawa and Ohsawa, Jpn. J. Appl. Phys. 32:1971(1993), Spruit et al, U.S. Pat. No. 5,153,873 (1992)).

Though the variety of proposed superresolution techniques attests to the long recognized need to improve the resolution of the light microscope for applications such as the far-field imaging of typical specimens such as sections of biological tissue, it appears that the practical gains for such applications have been effectively limited to less than a doubling of resolving power relative to the Abbe limit. Thus any system which could increase resolution beyond the state of the art, and especially one which could work in conjunction with present superresolution techniques to further extend resolution performance, could be of great value in the field of light microscopy and other fields of scanned optics.

OBJECTS AND ADVANTAGES

It is the primary object of the present invention to improve resolution in optical systems such as scanned fluorescent microscopes, in which, at each moment, a beam of light is focused to the smallest possible spot in a specimen to excite an excitable species in the spot.

Another object of the present invention, in such systems, is to minimize the light induced damage to a specimen resulting from photodynamic action.

Another object of the present invention, in such systems, is to minimize light induced bleaching and photolysis of the molecules responsible for absorption and emission.

Another object is to produce a method of fluorescent microscope resolution enhancement which is easily adapted to current laser confocal microscopes, two-photon excitation laser scanning microscopes, and fluorescent decay time contrast microscopes.

Another object is provide a method of resolution enhancement which will work synergistically with known super-resolution methods thereby increasing the resolution over these known techniques.

Another object is to allow high resolution epiillumination imaging of living biological specimens at greater tissue depths from the surface than is possible with current techniques.

Another object is to provide a resolution enhancement technology which can be adapted to the fields of high resolution photolithography, nanofabrication and digital computer memory storage and retrieval.

Still other advantages of the present invention will become evident in this disclosure.

SUMMARY OF THE INVENTION

The foregoing objects are achieved and the foregoing problems are solved in one illustrative embodiment of the invention, applied specifically to the field of fluorescence microscopy, although the principles embodied therein also apply to the other applications of the present invention discussed in this specification. This embodiment is an improvement of the laser scanning fluorescence microscope, wherein a scanned excitation beam is focused to a diffraction limited spot size and illuminates successive spots in a fluorescent specimen, exciting fluorescent dye molecules within these spots to fluorescence. Fluorescent light emanating from each of these illuminated spots is then electronically measured, and a spot of light the intensity of which varies in accordance with the measured fluorescence from these illuminated spots is scanned over a video monitor screen in correspondence with the scanning of the excitation beam over the specimen, to create a final image of the specimen. In the present invention, light of a wavelength adapted to quench fluorescent excitation of the excited dye molecules is focused in the specimen to a pattern containing a central minimum which is made concentric with the central maximum of the exciting radiation, the central points of the central maximum of the exciting beam and of the central minimum of the quenching beam substantially coinciding, so that within the central minimum region, the intensity of the quenching beam, and consequently the degree of quenching of the fluorescence, increases with distance from the central point, thereby decreasing the effective width of the distribution of probability of fluorescent excitation as a function of distance from the center of the illuminated spot, and consequently increasing the effective resolving power of the microscope.

BRIEF DESCRIPTION OF THE DRAWINGS

The principles of the invention will be more particularly discussed with reference to the accompanying drawings in which:

(FIG. 1A and FIG. 1B are collectively referred to in this specification as "FIG. 1");

DESCRIPTION OF THE INVENTION

Figure 1A:
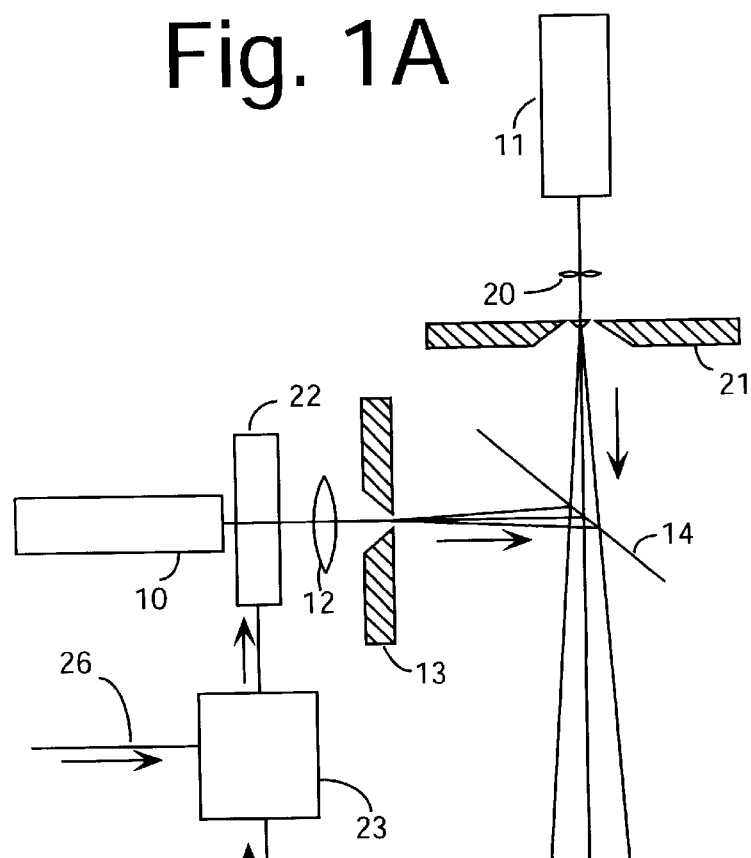
FIG. 1A is a schematic cross-sectional view of a scanning fluorescence microscope embodying the invention.
Figure 1B:
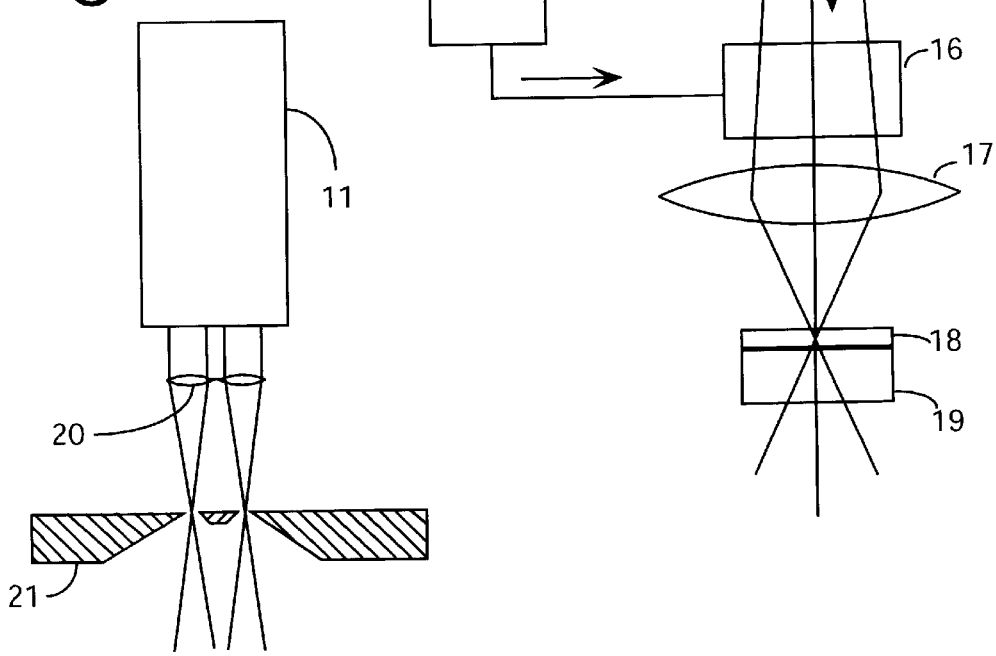
FIG. 1B is an enlarged view of the view shown in FIG. 1A.

FIGS. 1A and 1B show an embodiment of the present invention employing continuous wave laser illumination. Light from excitation laser 10 is focused by lens 12 onto pinhole aperture 13, and after passing through aperture 13, reflection from dichroic mirror beam splitters 14 and 15 and scanning by beam scanning means 16 (which may be a pair of orthogonal galvanometer powered scanning mirrors) the laser light is imaged by eyepiece 17 and objective 18 on or within the specimen 19 stained with fluorescent molecules excitable by light emitted by laser 10, to form a region of excited fluorescent molecules at the image of pinhole aperture 13. Quenching laser 11, which emits light of a wavelength adapted to quench, by means of stimulated emission, the fluorescent excitation caused by laser 10, is focused by toroidal lens 20 onto annular aperture 21. Light passing through aperture 21 passes through dichroic beam splitter 14, then is reflected by dichroic beam splitter 15 to pass through the beam scanning means 16, and is focused by eyepiece 17 and objective 18 onto specimen 19. In FIG. 1A, for purposes of illustration only, rays are show emanating from the central point of annular aperture 21 to simplify the illustration and to show that this central point is conjugate, with respect to beam splitter 14, to the central point of pinhole aperture 13, and it should be understood that since this central region of annular aperture 21 is in fact opaque, rays do not actually emanate from this central point. In FIG. 1B, a magnified detail showing laser 11, toroidal lens 22 and annular aperture 21, the rays are correctly shown focused by lens 22 onto and then emanating from the transparent ring of aperture 21. The mirror image relationship between the center of annular aperture 21 and pinhole aperture 13 insures that the projected image in the specimen 19 of annular aperture 21 is concentric with the image in the specimen of pinhole aperture 13. The diameter of annular aperture 21 is chosen so that the diameter in the specimen of the central ring of maximum intensity is the same as the diameter of the first minimum of an Airy disc point diffraction image which would be formed at the wavelength of the quenching laser 11. This means that the diameter in the specimen of the ring of maximum intensity for the quenching radiation is larger than the diameter of the first minimum of the point diffraction image of pinhole 13 by the ratio of the wavelength of the quenching laser to the wavelength of the excitation laser.

Fluorescent emission from those excited fluorescent molecules in the specimen in the focus of the excitation beam, which have not been quenched by the quenching beam, is collected by objective 18, directed successively through eyepiece 17, beam scanning means 16, beam splitter 15, and blocking filter 27 adapted to block reflected excitation and quenching light, to viewing pinhole aperture 22, which is conjugate to pinhole aperture 13. Emitted light passing through aperture 22 is detected by photodetector 23 (which may be a photomultiplier tube) the output of which is directed to video frame store 24, which is synchronized by the scan drive circuit 25 which powers the beam scanning means 16. The information contents of the video frame store 24, as manipulated by appropriate image processing means, is displayed on video monitor 26, producing an image of the scanned plane of the specimen 19.

Figure 2:
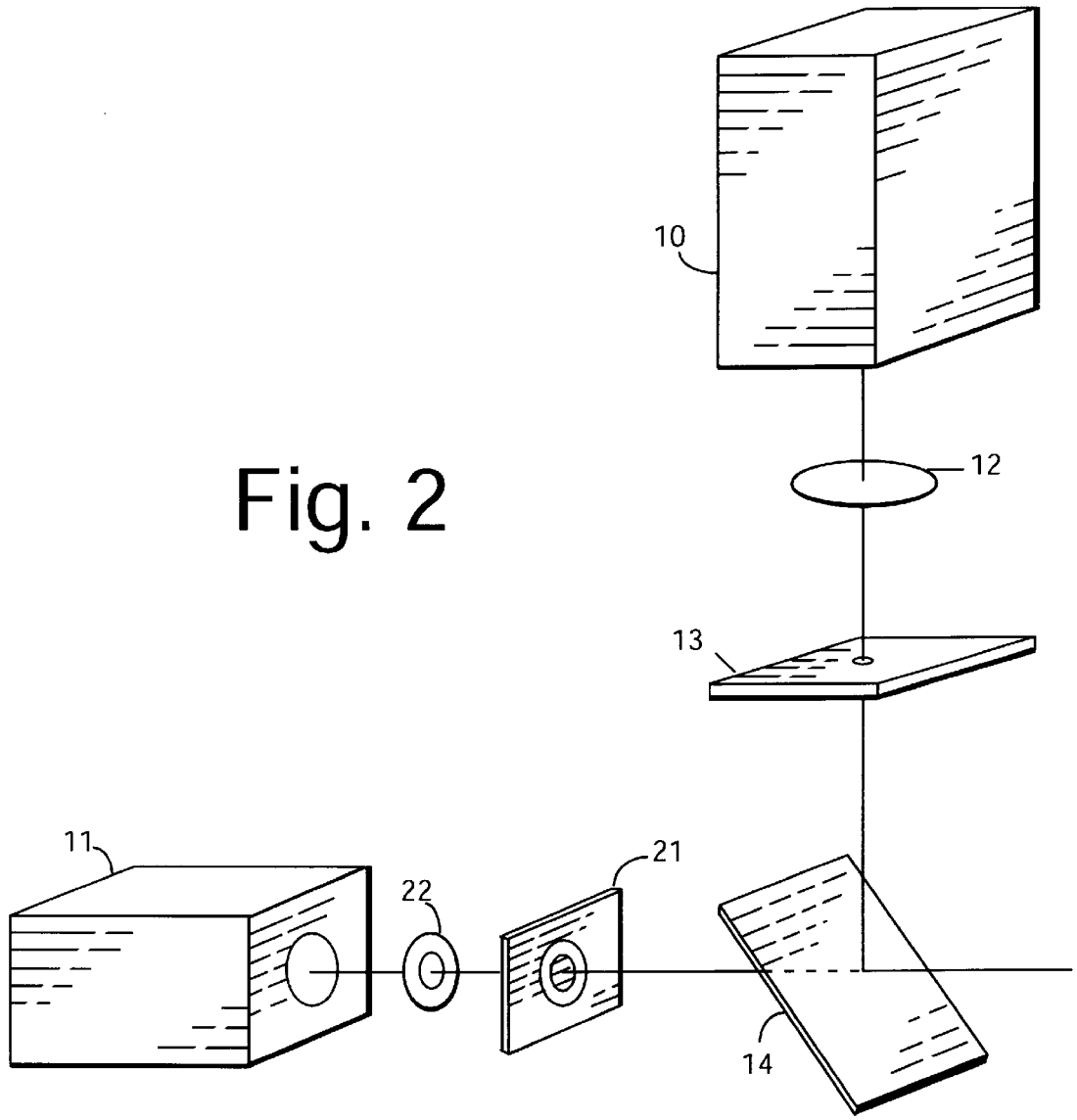
FIG. 2 is a perspective view showing a portion of the device of FIG. 1.

FIG. 2 shows a perspective detail of a portion of the apparatus of FIGS. 1A and 1B. It should be noted that for purposes of illustration, the openings of pinhole aperture 13 and annular aperture 21 are shown larger than the scale of the rest of the elements in this figure. Although in principle, completely different optical systems could be used to project a central minimum of quenching radiation so its center coincides in the specimen with the central point of the central maximum of the exciting radiation, for use in a scanning microscope application, the sharing of focusing optics, made possible by the use of beam splitter 14, insures that provided the focusing and scanning systems are achromatic, the required coincidence between the central points of these images will be guaranteed even at the precision required in high resolution microscopy, once the apertures 13 and 21 are aligned at one scan position, because perturbations, for example due to inhomogeneities in the specimen above the plane of focus, distort the excitation and quenching beams equally. In case focusing optics which have been achromatized for the choice of excitation and quenching wavelengths are unavailable, it is possible to longitudinally shift aperture 21 relative to the position conjugate to aperture 13 with respect to beam splitter 14, so that the images of the two apertures are coplanar and concentric in the specimen. Since such an arrangement will only provide correction for the axial focal point, scanning can be provided in such an arrangement, for example by lateral movement of the specimen.

Why the present invention will cause an improvement in resolving power is shown in FIGS. 3A–3D, which shows how quenching, applied according the present invention, can reduce the nominal width of the distribution indicating the probability that a given probe fluorescent molecule in the specimen will be in its fluorescently excited state, as a function of the distance of this molecule from the center of the central maximum of the focused excitation beam. Two assumptions have been made to simplify this illustration. First it is assumed that this probability of excitation of the fluorescent molecule is proportional to the intensity of exciting illumination incident on the molecule. Secondly, the illustration is applied specifically to the imaging of the central spot of the microscope field, where the center of the spot intersects the optical axis of the objective 18.

Figure 3:
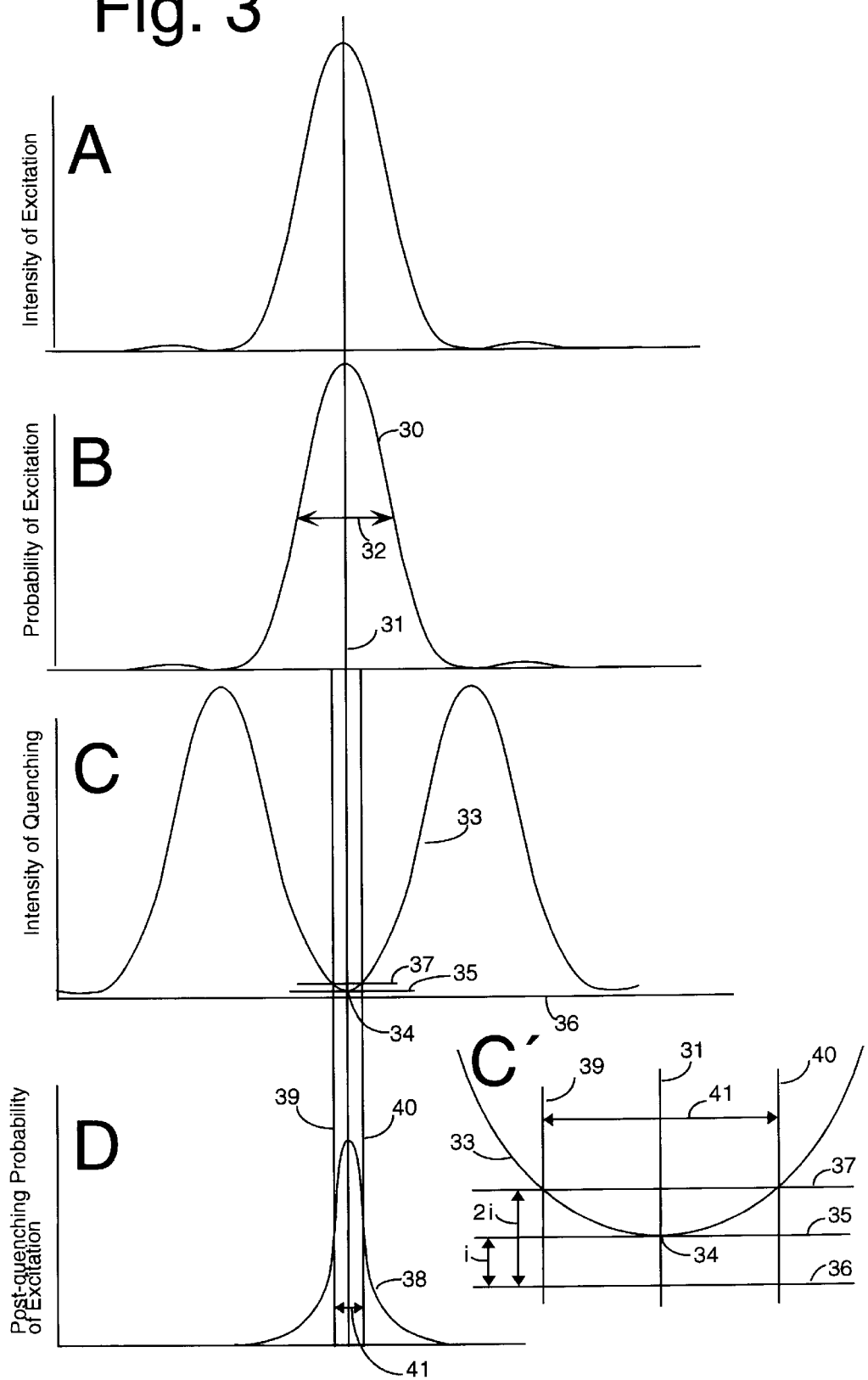
FIGS. 3A–3D are graphs showing the intensity distributions at the plane of focus for the excitation and quenching beams, and the resultant fluorescence excitation probability distribution due to the joint interaction of these beams with the specimen.

FIG. 3A shows the expected light intensity distribution of the "Airy disc" or diffraction image of excitation pinhole aperture 13 projected in the specimen 19 by eyepiece 17 and objective 18. The use of the axial point as the example in this illustration means that the spatial coordinate in the distribution is simply the distance, in the plane of focus, from the axis of objective 18, this distance being shown by distance from the vertical line 31 common to FIG. 3A, B, C and D. The vertical axis in these figures represents either light intensity or excitation probability, where the upward direction corresponds to increases. The description of imaging of non-axial points is somewhat more complicated than this present axial case, but resolution enhancement works in the same way. FIG. 3B shows the probability of excitation 30 of a fluorophore molecule as a function of the distance in the focal plane between the axis and that molecule. The assumption of a proportional excitation response by the fluorophore means that this excitation probability distribution 30 shown in FIG. 3B is proportional to the diffraction image distribution shown in FIG. 3A. In a case where the excitation probability was not proportional to excitation intensity, for example because excitation saturated the dye causing the top of the central maximum of curve 30 in FIG. 3B to be flattened with respect to the curve of FIG. 3A, the following arguments for the shrinkage of the width of the excitation probability curve are still valid.

The nominal width of the central maximum of the excitation probability distribution is shown by the double arrow 32, which measures the distance between the two points in the distribution where the probability of excitation is half maximal. (When this distribution is imagined in the two dimensions of the plane of focus, double arrow 32 indicates the diameter of the circle where the probability of excitation is half the maximum probability). The object of the present invention is to apply the quenching radiation in a pattern which preferentially decreases the probability of resulting excitation in peripheral portions of the central maximum of the excitation probability curve, while sparing, as much as possible, the probability of excitation in the central portion, thereby narrowing the nominal width of the probability of excitation curve.

FIG. 3C shows the expected intensity distribution 33 of the image, projected in the specimen, of annular aperture 21, which is illuminated by the quenching beam. The mean radius of annular aperture 21 is such that, by diffraction theory, the diffraction image in the specimen resulting from the contribution from of each small section on the ring of annular aperture 21, taken in isolation, has an intensity of zero on the optical axis (i.e., the first minimum passes through the optical axis), so that as the light emanating from each of the small sections on the ring of aperture 21 summates to create an image of annular aperture 21 in the specimen, the sum, at this central axial point, of the zero intensities from each of the sections of the aperture 21 still adds to zero. However, scattering in the optics of the instrument and in the specimen causes the central minimum on the optical axis, in fact, to have a small but finite intensity i shown by the horizontal line 35, which is above the zero intensity baseline 36. The term "central minimum" is used herein analogously to the more common expression "central maximum" and refers to the fact the image has a minimum at its center, even if the image as a whole is not centered with respect to the optical axis, as when non-axial points are imaged.

In this particular example, the power of the quenching beam produced by laser 11 is adjusted to the intensity required to quench half of the probability of fluorescence at the central point 34 of the central minimum. A doubling of the intensity of the quenching beam from its intensity at the central minimum point 34 would substantially cause a doubling of the quenching, or in other words create an additional halving of the probability of fluorescent excitation, leaving one quarter of the unquenched probability. Therefore at the radius of the central minimum where the intensity of the quenching beam shown by the horizontal line 37 is twice the intensity at the central point 34 of the central minimum, the probability of excitation of a fluorophore molecule will be substantially one quarter of the unquenched probability. FIG. 3C' shows a magnified detail of the central minimum of the quenching beam shown in FIG. 3C.

FIG. 3D shows the distribution 38 of the probability of fluorescent excitation, subject to quenching by the quenching beam. Vertical lines 39 and 40, drawn at the radius where the probability of excitation subject to quenching is 25% of the unquenched probability, and hence half the probability at the central point, where the post quenching probability is 50% of the unquenched probability, define the nominal width of the fluorescence excitation probability distribution subject to quenching sharpening. The nominal width of the central maximum of the probability distribution, defined here as the full width between the half maximum probability points, shown by the double arrow 41, is clearly smaller than the width 32 of the unquenched probability distribution.

The relationship between the probability of excitation distribution curves and resolution may be seen by considering changes in the total fluorescent emission from the specimen during the time the scanning beam scans over a single fluorescent microsphere of a diameter significantly smaller than the nominal width shown by the double arrow 41. At each time during the scan, the probability of excitation of the dye molecules in the microsphere, and hence the total emission from the microsphere, is proportional to the probability of excitation indicated by the excitation probability curve for the distance between the microsphere and the central point of the scanning beam. Thus after the scan is completed, and the curve of measured fluorescence is plotted so the x axis is shown at the same spatial scale as FIGS. 3A–3D, (assuming linearity of the photodetector) the measured curve will exactly parallel the curve 38 of FIG. 3D. The probability of excitation distribution curve therefore has the analogous relationship to fluorescence flying spot microscopy that the illumination spot intensity distribution curve does to reflectance flying spot microscopy, and the width of these distributions are related to resolution in the same way. Thus it is evident that with the excitation probability distribution of FIG. 3D the resolution is better than for the distribution of FIG. 3B (i.e., the distribution for a microscope with the same excitation focusing optics, but without quench sharpening provided by the present invention) by the ratio of the lengths of double arrow 32 to double arrow 41. Assuming that the objective 18 has a numerical aperture of 1.4 and that the excitation laser has a wavelength of about 500 nm, then the width (measured by double arrow 23) of the unquenched excitation probability distribution will be about 200 nm, and (with the illustrated residual intensity at the central point of the central minimum) the width of the quenched excitation probability (indicated by double arrow 41) will be about 50 nm. However, with the central minimum of the shape suggested in FIG. 3C and C', where even the smallest displacement away from the central point will result in at least some small elevation in intensity, then provided sufficiently powerful light sources are available, provided the specimen is tolerant to the high intensities of the quenching beam and provided scattering in the specimen and the optics can reduced to bring the intensity of the central point of the minimum close to zero, there does not appear to be any set limit to resolution achievable with the present invention.

It may be seen from FIGS. 3A–3D that the percent change in intensity as a function of distance from the center of a diffraction limited central minimum can be far greater than the percent change in intensity as a function of distance from the center of a central maximum, diffraction limited by the same optics. It is the use of selective quenching in the present invention, as the mode of interaction between the two beams focused on the specimen, that allows this sharp intensity gradient in a central minimum to transfer to the sharpness of the final image. FIGS. 3A–3D also show that only a small part of the energy of the quenching beam, in the central part where the intensity is lowest, is involved in resolution enhancement. This means that for each milliwatt of laser energy needed in the crucial central part of the quenching laser beam, a total beam power of perhaps hundreds of milliwatts may be required. However such powers are easily attainable with available lasers. Furthermore, high intensities of the quenching beam in the bright ring surrounding the central minimum do not degrade the image because the final fluorescence intensity can never be lower than zero, so high quenching intensities will saturate at zero fluorescence. Also, the quenching photons, themselves, are blocked by filter 27 and dichroic mirror 15 from reaching photodetector 23. Therefore, from the point of view of image quality, the intensity of the quenching beam can be adjusted for optimal sharpening at the center of the intensity minimum, without worry about the high intensities surrounding the central minimum. From the point of view of specimen and fluorophore damage, in the presence of excited fluorophores capable of producing photodynamic damage, quenching radiation, by deexciting the excited species can reduce such damage, so that by choice of a quenching wavelength where there is negligible absorption by the specimen except by excited fluorophore molecules, high quenching intensities are not simply tolerable, but can actually be beneficial.

Under the conditions described above to produce the minimum in the focal plane, the intensity distribution measured along the optical axis also has a minimum sharing the same central point. As is the case with microscope objectives generally, in which the width of the central maximum of the point diffraction image, measured in the focal plane perpendicular to the optical axis, is smaller than the width measured along the optical axis, resulting in a better lateral resolution than longitudinal resolution, this same elongation along the optical axis occurs with the central minimum of the diffraction image of the annular aperture 21, so that in general, following resolution enhancement by the apparatus shown in FIGS. 1A and 1B, longitudinal resolution will also be improved by quench sharpening, but the lateral resolution will still be better than the longitudinal resolution.

Figure 4:
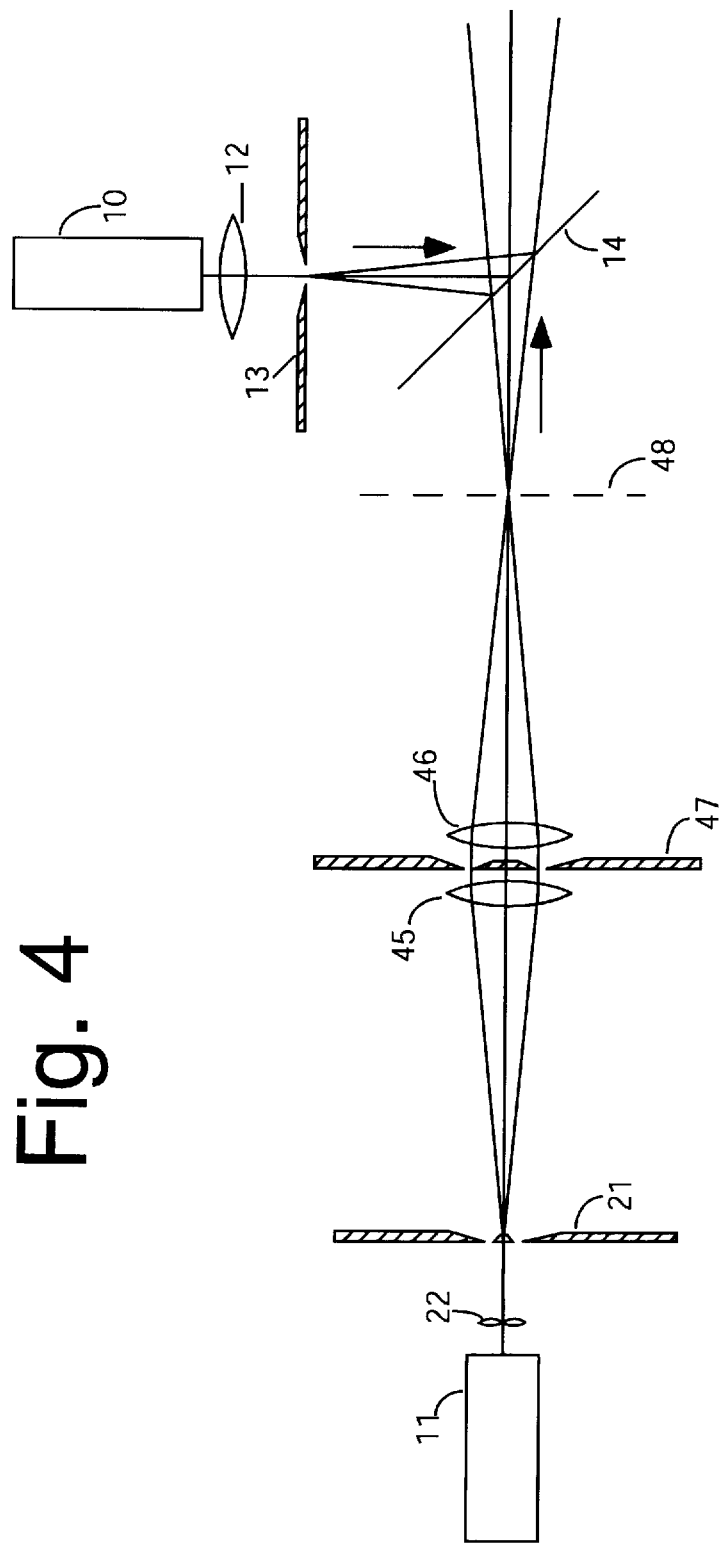
FIG. 4 is a schematic cross-sectional view of a portion of a variant of the device shown in FIG. 1 to illustrate the use of an annular aperture in an aperture plane to further increase resolving power.

FIG. 4 shows how the resolution of the present invention might be increased by combining the field plane annular aperture used in the present invention to create in the specimen a quenching beam pattern with a central minimum, with an aperture plane annular aperture to improve the lateral resolution of that quenching beam pattern. (Born and White, Principles of Optics, 3rd edition, p. 416). A relay lens system consisting of lenses 45 and 46 with annular aperture 47 in an aperture plane, images annular aperture 21 onto a real image plane 48 which is conjugate to pinhole 13 relative to the beam splitting mirror 14 (i.e., real image plane 48 is in the same plane as annular aperture 21 in FIG. 1 before being displaced to the position shown in FIG. 4). The diameter of annular aperture 21 is readjusted to cause the central minimum in its image in the specimen to have a minimum intensity. The use of an aperture plane annular aperture 47 in addition to the field plane annular aperture 21, causes the central minimum in the specimen to have a smaller width, to improve lateral resolution, and at the same time to have a reduced resolution in the axial dimension for improved depth-of-field. Instead of the annular aperture 47 in the aperture plane of the relay lens system, there can be a complex aperture of different annuli, each with specified phase retardation and opacity, for further decreases in the width of the central maximum, as shown originally by Toraldo di Francia (Nuovo Cimento, Suppl. 9:426 (1952)). It should be noted that in the design of such an aperture plane aperture 47, it is more important to maximize the sharpness of the first minimum of the point spread function rather than the usual design criterion of maximizing the sharpness of the central maximum. (The central minimum might also be "sculpted" to optimize, for example, a particular desired tradeoff between image brightness and resolution, by replacing the uniform ring of aperture 21 with a series of annuli of independently controllable phase retardation and absorption, in addition to the choice of phase retardations and absorptions for annular rings in the aperture plane aperture 47.) It should also be appreciated that a major problem with Toraldo type aperture plane apertures, namely the defection of beam power away from the central maximum, causing problems of reduced contrast and increased photobleaching and photodynamic specimen damage, are overcome in the present invention, because, as described above, light from the quenching beam outside the central minimum, does not degrade image contrast or increase photobleaching or photodynamic damage.

Figure 5:
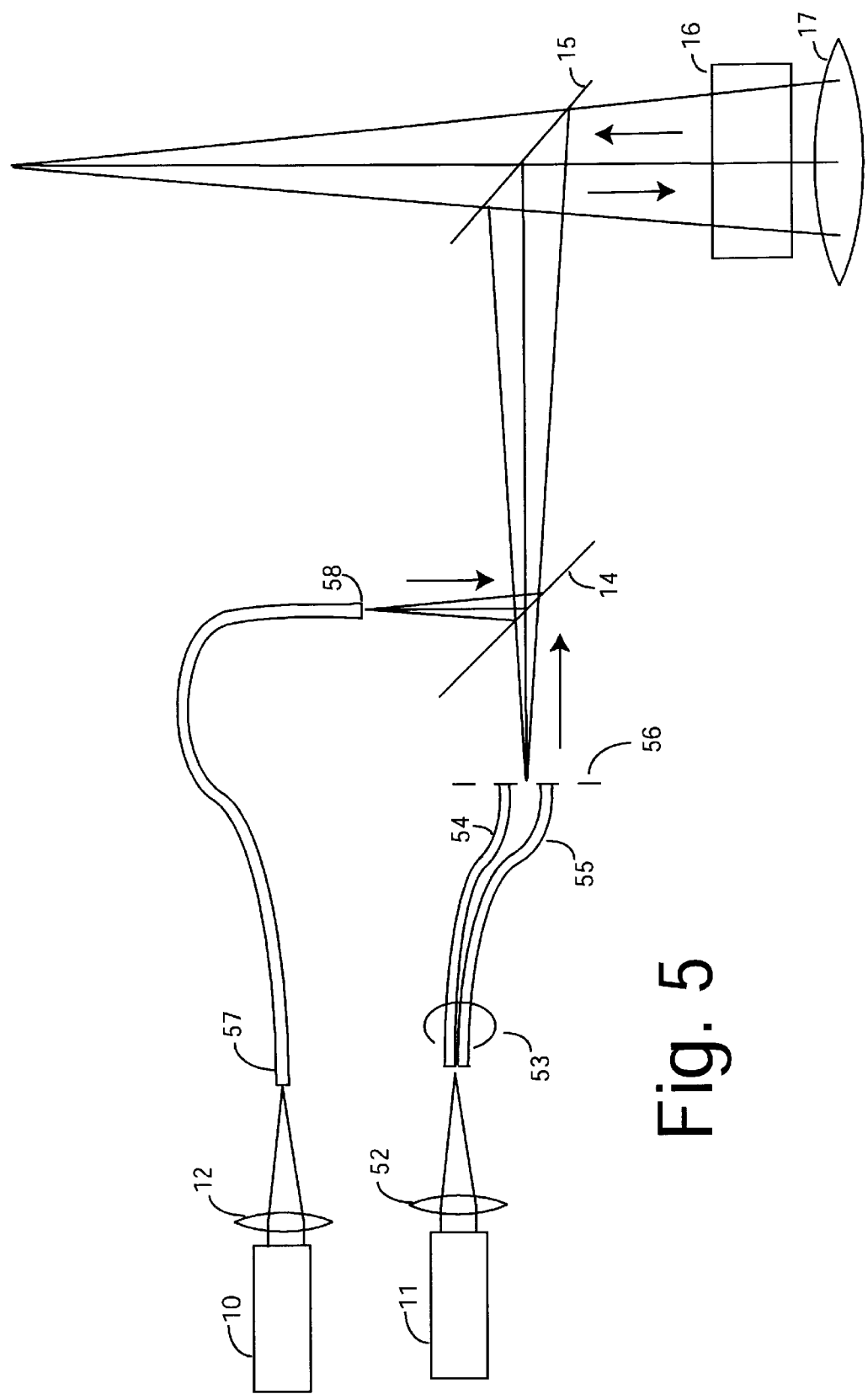
FIG. 5 is a schematic cross-sectional view of a portion of another variant of the device shown in FIG. 1 to illustrate the use of a plurality of optical fibers to transmit excitation and quenching radiation between the lasers and the microscope.

FIG. 5 shows an embodiment of the present invention, in which a plurality of optical fibers illuminated by the quenching laser, the non-illuminated ends of which are located at corners of a polygon, serves as an object to be imaged in the specimen, in order to shape the quenching beam with the required intensity pattern having a central minimum. The illuminated optical fibers, of which representative fibers 54 and 55 are shown in FIG. 5, are bundled together at one end to produce a fiber bundle 53. Light from laser 11 is focused by lens 52 to converge on and illuminate bundle 53. The non-illuminated ends of fibers 54 and 55 are located at corners of a polygon in the same plane 56 as the annular aperture 21 of FIGS. 1A and 1B, the corners of this polygon lying on a circle of the same radius as the radius of the annulus of the replaced aperture 21. In other words, the image of this polygon in the specimen 19 (not illustrated in FIG. 5) is of a size such that the distance from the center of such image to each of the imaged polygon corners is the distance between the central point of the central maximum and the first minimum of the point diffraction image, at the wavelength of the quenching radiation. Therefore the center of the projected image in the specimen of this polygon is a central minimum, as required in the present invention to be superimposed, in the specimen, with the central maximum of exciting radiation. A coupled system of arms (not illustrated) may adjust the non-illuminated ends of the optical fibers such that the size of the polygon of the non-illuminated fiber ends may be varied, in order to minimize the intensity at the central minimum, as the wavelength of laser 11 is changed, in accordance with the changing requirements of different fluorescent dyes in specimen 19. Exciting radiation originating from laser 10 is focused by lens 12 to one end of fiber 57. The non-illuminated end 58 of fiber 57 is conjugate, relative to dichroic beam splitter 14, to the center of the polygon of non-illuminated ends of quenching beam optical fibers at plane 56, therefore insuring the required overlap in the specimen of the central minimum of the quenching radiation with the central maximum of the exciting radiation. It should be noted in the embodiment of FIG. 5, that a simple lens 12 replaces the less widely available toroidal lens 22 required in the embodiment of FIGS. 1A and 1B, and that the lasers 10 and 11 can be remote from the microscope body, coupled by just optical fibers.

Figure 6:
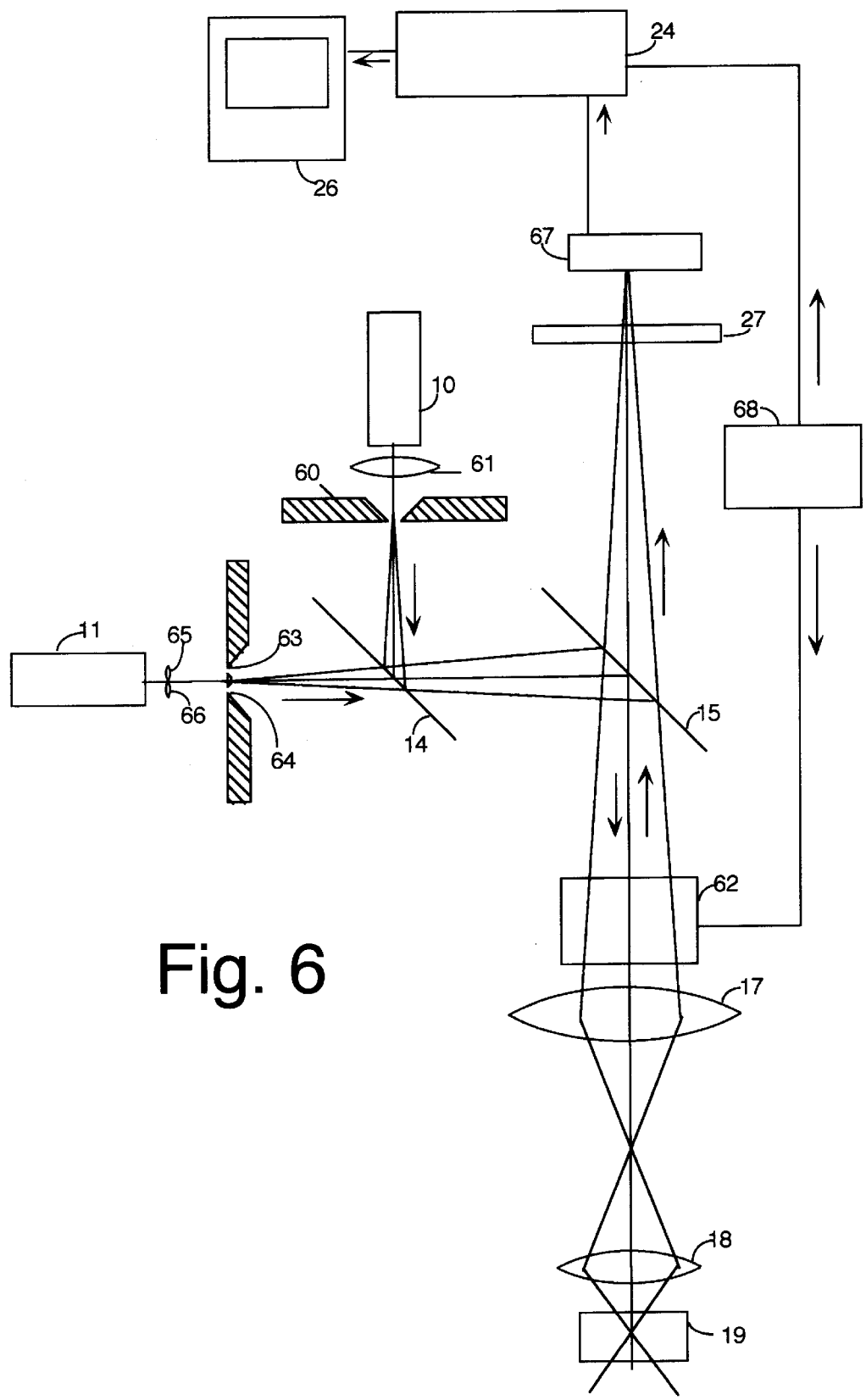
FIG. 6 is a schematic cross-sectional view of an embodiment of the present invention using slit apertures.

FIG. 6 shows an embodiment of the present invention where the pinhole aperture 13 of FIG. 1A is replaced by a slit aperture 60, which is illuminated by the same excitation laser 10 as in FIG. 1A, but where the beam emanating therefrom is focused by cylindrical lens 61 to a line coincident with the slit in aperture 60. Slit aperture 60 in the cross-sectional view of FIG. 6 appears identical to the cross-sectional view of pinhole aperture 13 in FIG. 1A. The beam emanating from aperture 60 is reflected successively by dichroic mirror beam splitters 14 and 15, identical to those shown in the device of FIG. 1A, and is passed through beam scanning means 62, which differs from the scanning means 16 of FIG. 1A because it is required to scan in just one dimension. The scanned beam is focused by the successive eyepiece 17 and objective 18 lenses onto specimen. 19, identical to those of FIG. 1A, however the image of the excitation beam in the specimen 19 is an illuminated strip, with a central maximum which is elongate in the dimension parallel to the strip. The nominal width of such an elongate central maximum is defined herein as the distance between the lines where the intensity is half-maximal. The quenching laser 11 is directed on two parallel slits 63 and 64, by means of two parallel cylindrical lenses 65 and 66. The spacing between slits 63 and 64 is such that the first minima of their diffraction images in the specimen 19 coincide to produce a central minimum, made to coincide with the central maximum of the diffraction image in the specimen of slit 60, such that the central line of the central maximum coincides with the central line of the central minimum of the focused quenching light. Fluorescent emission from specimen 19 is focused by successive objective 18 and eyepiece 17 lenses to focus light from the central maximum in the specimen onto a linear photodiode array 67, oriented perpendicular to the plane of FIG. 6. The output from array 67 is stored in video frame store 24 which is synchronized by the output of the scan drive circuit 68 which drives the one dimensional beam scanner 62.

The advantage of a one-dimensionally scanned strip arrangement as in FIG. 6 compared with a two dimensionally scanned spot arrangement as in FIG. 1A, is that one less dimension in scanning is required,.so much faster scans at a higher scan frequency can be produced, and the apparatus is simpler. The disadvantage is that the resolution gain of the present invention is secured only in one dimension. However for many applications a gain in resolution in just one dimension is sufficient, and the simplicity and scanning speed of the slit arrangement are preferred. It should be noted that instead scanning produced by beam scanning means 16 or 62, the required relative movement between specimen and the image of the focused light beams in the specimen can be produced by movement of the specimen, or an optical element in the light path between the light source and the specimen, synchronized with the image acquisition process of frame store 24.

Figure 7:
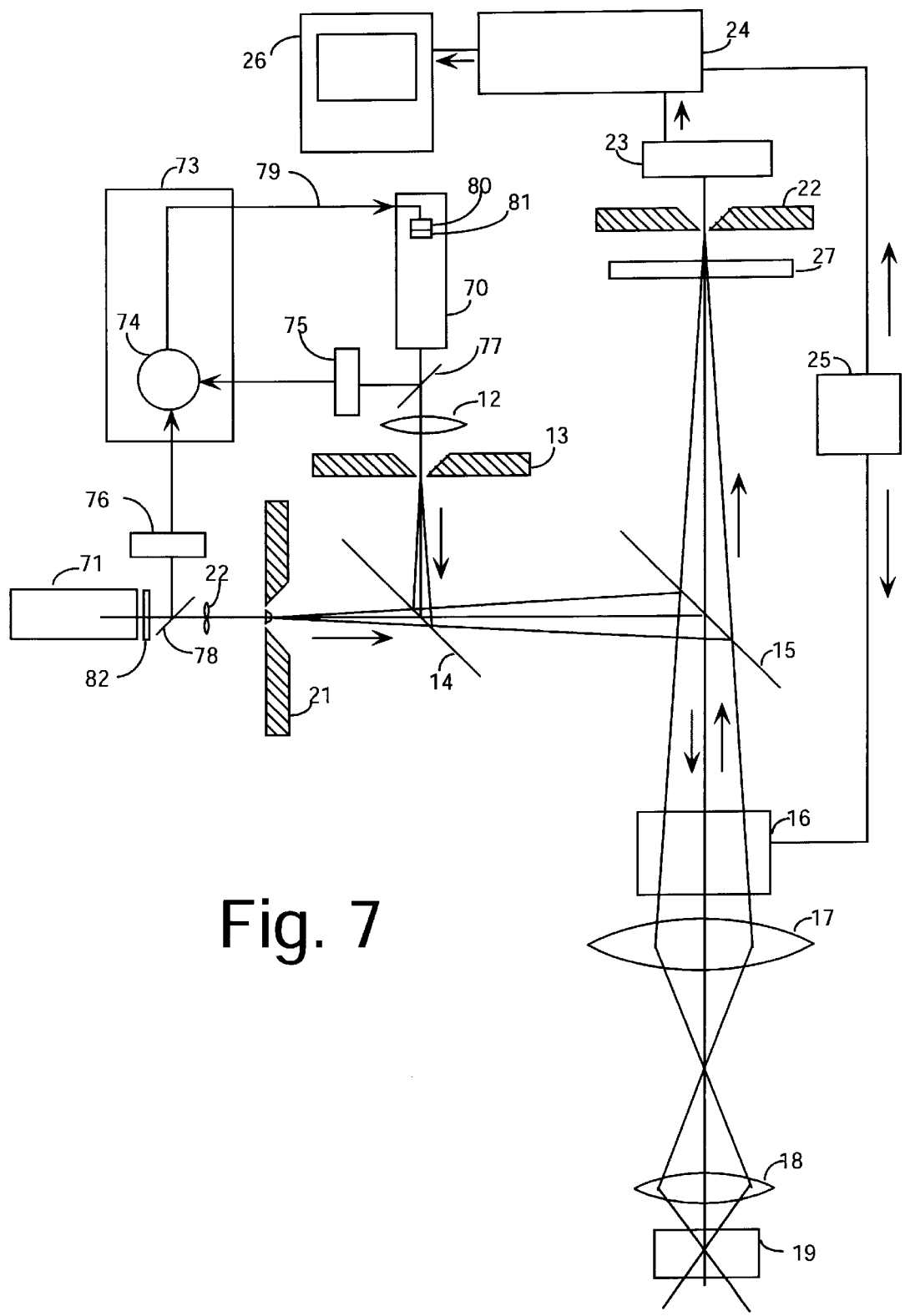
FIG. 7 is a schematic cross-sectional view of the present invention wherein the excitation and quenching beams are presented as successive ultrashort pulses.

FIG. 7 illustrates an embodiment of the present invention employing synchronized ultrashort-pulse (shorter than a few picoseconds), repetitively pulsing lasers for excitation and quenching. In particular, the pulse output from the lasers is adjusted so that the quenching beam is turned on within picoseconds of the offset of the excitation beam, before there has been any time for significant fluorescent emission, so that virtually all such emission will follow the offset of the quenching beam. There are significant advantages of such a pulsed laser embodiment of the present invention compared to embodiments wherein the excitation and quenching beams are continuously on. Most importantly, there is more efficient quenching per watt of average quenching beam power. This may be understood from a specific example where the excitation pulse frequency is assumed to be 100 MHz, and the fluorophore is assumed to have a 1 ns half-life for the excited state. (For the purpose of this example it is assumed that the fluorophore is very efficient, so in the absence of optical quenching, the excited state decays almost exclusively by fluorescent emission.) If it is assumed that each quenching photon incident on the fluorophore has a 20% probability of quenching it, then 10 incident photons together would have about a 90% chance of producing quenching. If these 10 quenching photons were delivered within several picoseconds following each excitation, then substantially all the quenching would take place before there was an opportunity for fluorescence so the resulting quenching would be 90%. However if these 10 quenching photons were emitted by a continuous wave laser, so they arrived spaced over the 10 ns interval between excitation pulses, after the first nanosecond, there would have been roughly a 50% likelihood of fluorescent emission, but only roughly a 20% likelihood of quenching, and obviously any quenching photons which arrive after the fluorescent emission have zero effect. In other words, bunching the photons in the interval immediately after excitation greatly improves the quenching efficiency. The quenching efficiency can be further increased in a pulsed system by making the excitation and quenching lasers have the same polarization, so there is insufficient time for a significant change in direction of polarization by rotation of the fluorophore between excitation and quenching, hence the quenching laser will be optimally aligned with the excited molecules.

The pulsed laser embodiment of the present invention shown in FIG. 7 has additional advantages. The ultrafast laser excitation makes it convenient to excite fluorescence by two-photon absorption (Denk, et al Science 248:73 (1990), Denk, et al U.S. Pat. No. 5,034,613 (1991)), which substantially confines light induced damage and photobleaching to the plane of focus, and provides illumination with light of a relatively long wavelength which can penetrate to greater depths of tissue. Unfortunately, with state of the art two-photon microscopy, the advantage of limitation of excitation to the plane of focus is gained (for a given fluorophore) only with some loss of lateral resolution (Sheppard and Gu, Optik 86:104 (1990)). However in the present invention, the quenching beam rather than the excitation beam is the principal determiner of lateral resolution, so that two-photon excitation can be used for excitation, with the resulting confinement in excitation, and the use of single-photon absorption for quenching insures high lateral resolution. Still an additional advantage of the pulsed embodiment shown in FIG. 7 is that laser dyes and their local environments can be characterized by fluorescence lifetime measurements, with minimal additional equipment costs. Furthermore, with a photodetector 23 that is not blinded by direct reflections from the laser pulses, time discrimination can replace the wavelength discriminating blocking filter 27, thus avoiding one source of light wastage. For all of these reasons, the embodiment shown in FIG. 7 is the preferred embodiment of the present invention.

In FIG. 7, excitation laser 70 and quenching laser 71 are ultrashort pulse mode-locked lasers, using, for example, optically pumped Ti-sapphire, dye or Cr-forsterite as the active medium. These types of lasers result in a repetitive train of pulses of duration from about 100 femtoseconds to several picoseconds, and at a frequency of about 50 to 100 MHz which depends on the length of the laser cavity. Lasers 70 and 71 are synchronized by means of a phased locked loop synchronizing circuit 73, which, by means of phase detector 74 detects phase difference between the amplified and filtered electrical outputs of high frequency response photodetectors 75 and 76, which receive a portion of the output beams of lasers 70 and 71 respectively by means of beam splitters 77 and 78. The output 79 of circuit 73, representing a correction signal to stabilize the desired phase difference between the pulse trains from the two lasers, is applied to a piezoelectric actuator 80 which controls the longitudinal position of one of the end mirrors 81 of the cavity of laser 70, thereby adjusting the laser pulse frequency, and thus stabilizing this phase difference. The desired phase difference, where the pulse from laser 71 follows the offset of the pulse from laser 70 by an interval from zero to several picoseconds can be adjusted either electrically in circuit 74, for example by adding a controlled phase shift to one of the inputs of phase detector 74, or optically by means of adjusting the optical path difference between the outputs of the two lasers. A commercially available unit to implement circuit 73 is the Model 3930 Lok-to-Clock™ Electronics Control from Spectra-Physics Lasers, Inc., Mountain View, Calif., which can be used when the lasers 70 and 71 are Spectra-Physics Model 3960C Tsunami™ Ti-sapphire lasers. FIG. 7 also shows a frequency doubling crystal 82, which can be optionally placed in the beam path of the quenching laser to halve the output wavelength. This doubling crystal 82 is representative of such frequency multiplying means which can be placed in the path of either laser to change the output wavelength. Both lasers 70 and 71 may be pumped by a common argon ion laser (unillustrated) with a divided output. Apart from the lasers 70 and 71 and their synchronizing apparatus, all the elements in the embodiment shown in FIG. 7 are substantially identical to and serve substantially the identical function to the respective elements shown in FIG. 1A, so they are numbered with the same numerals as FIG. 1A, and are described by the text corresponding to FIG. 1A.

Many alternative methods of producing two beams of synchronized ultrashort pulses are known in the art. The synchronization between lasers 70 and 71 could be by means of a purely optical coupling, for example by having both lasers optically pumped by the pulsed output of a synchronous pumping laser (Moritz, N. et al, Optics Comm. 103:461 (1993)). Still another possibility is for a portion of the light output of the excitation laser 70 to be used as a synchronous pump energy source for the quenching laser 71 (or vice versa). Another possibility is to provide a single laser which emits ultrashort pulses in the near i.r., for example the 1.3 $\mu$m output of a Cr-forsterite laser in a self-modelock configuration, or the 1.5 $\mu$m, 2 ps, 27 MHz output of a Er, Yb doped fiber laser (Laser Focus World, July 1993 p. 15) and split the output into a portion directed through a frequency doubler crystal and a frequency tripler crystal to derive the quenching and excitation beams respectively. Furthermore, the recently commercially available optical parametric oscillator coherent light sources intrinsically produce simultaneous outputs at several wavelengths, which, if necessary, can be frequency multiplied to the range required for a broad range of fluorescent dyes. Finally it has been possible to produce two color pulses from the same laser(de Barros M. R. X. and Pecker, P. C., Optics Lett. 18:631(1993)), and the outputs could be separated by wavelength for use as the excitation and quenching beams.

The quenching radiation emitted by laser 11 or 71 must be of a wavelength adapted to induce stimulated emission from the fluorescent dye molecules in specimen 19, and consequently must be of a wavelength where there is significant fluorescent emission. Furthermore, it is important that this quenching radiation not itself fluorescently excite ground state fluorescent molecules. These simultaneous requirements may be met in several ways. In dyes such as a the coumerin derivatives with relatively large Stokes shifts, the excitation spectrum has dropped to a negligible level in the long wavelength portion of the fluorescent emission spectrum. Alternatively, these requirements may be met in a fluorescent dye with a large probability for transition between the ground vibrational level of the first electronically excited singlet (i.e., the fluorescently excited state) to the second vibrational level of the ground state, such that at the wavelength corresponding to this transition, there is still a significant emission likelihood, and hence a significant stimulated emission cross-section, but the wavelength is long enough that the absorption of the quenching light by the the ground state fluorophores has dropped to essentially zero. When used for biological microscopy, additional desired attributes for a dye in the present application which are also generally desirable for any fluorescent dye in a biological microscopy application are that it have a high fluorescent efficiency, that it be commercially available in forms such as antibody and dextran conjugates, and that it have a low intersystem crossing probability for production of triplet states (or be self quenching for triplet excitation). A large two-photon excitation cross-section leaves open the possibility of excitation by two-photon excitation. Finally, the excitation and quenching wavelengths must be chosen with respect to cost and availability limitations of the excitation and quenching lasers.

The choice of wavelength of excitation and quenching is also subject to a tradeoff since shorter wavelengths lead to increased resolution by the classical resolution criteria, whereas longer wavelengths, especially above 630 nm (Puppels, G. J., et al, Exptl. Cell. Res. 195:361(1991)) are reported to be less toxic to biological tissue at high power densities and can penetrate biological tissue with less scattering. In fact, as discussed, the lowering of scattering may be more critical to achieving good resolution in the present invention than the resolution performance as predicted by diffraction theory for a non-scattering medium, because it may allow a lower intensity at the central minimum of the quenching beam focus. In case it is necessary to use a quenching beam in a part of the spectrum which can be injurious to the specimen, these quenching photons can be used most efficiently by insuring that the just preceding excitation pulse was of sufficient intensity to nearly saturate the fluorescent excitation. For relatively inefficient fluorescent dyes this may require reducing the frequency of the pulse output of laser 70, so that for a given time averaged power output, the power per pulse increases. On the other hand, with an efficient fluorophore, there might be near saturation with each pulse, even with a few milliwatts average beam power and a frequency of about 80 MHz. (see Tsien and Waggoner, Fluorophores for Confocal Microscopy, in Handbook of Confocal Microscopy, James B. Pawley, ed., Plenum, New York, 1990).

The recently developed cyanine dye, Cy5, has been reported to be easily conjugated to antibodies, avidin, DNA and other molecules important in fluorescence biomicroscopy and, in addition, possesses the desirable qualities of a high quantum efficiency, stability and long wavelength excitation (Majumdar, et al, Bioconjugate Chem. 4:105 (1993)). The embodiment illustrated in FIG. 7, when outfitted with Ti-sapphire lasers could excite Cy5 by setting the excitation laser 70 at the 680 nm low wavelength end of the laser's tuning range, and quench by setting laser 71 at about 740 nm. The coumarin dyes are commercially available conjugated to molecules useful in fluorescence microscopy (Molecular Probes, Inc. Eugene, Oreg.), and have the advantage of a large Stokes shift to minimize unwanted fluorescence excitation by the quenching beam. Furthermore they have a large stimulated emission cross section, as evidenced by their widespread use in dye lasers, and they also have been successfully used in two-photon excitation microscopy (Denk et al, Science 248:73 (1990)). The dye coumarin 1 (7-diethylamine-4-methylcoumarin) can be excited by two photon excitation by a Ti-sapphire laser set to about 700 nm. Quenching can be by the frequency doubled 950 nm output of the Ti-sapphire laser, to produce pulses at 475 nm. The widely used dye, lucifer yellow, has the advantage of a very large Stokes shift, and can be two-photon excited by the output of a Ti-sapphire laser at 850 nm or single photon excited by the frequency doubled 850 nm output (i.e., 425 nm), and the quenching beam can be the frequency doubled 1080 nm output of the Ti-sapphire laser (i.e., at 540 nm). Because of lucifer yellow's large Stokes shift, it is possible to quench by tuning the quenching laser in the optimum of the emission band, which is also at the long wavelength cutoff region of the frequency doubled Ti-sapphire laser. It may desirable to lengthen the pulse width for the quenching beam to, say, 10 picoseconds, both to eliminate two-photon fluorescence excitation in the UV portion of the lucifer yellow excitation spectrum, and also to sharpen the spectral spread so that a narrow band rejection beam filter 27 can eliminate unwanted direct and scattered light from the quenching laser from adding noise to the fluorescence signal recorded by the photodetector 23. Alternatively, or in addition to spectral filtering of this direct and scattered quenching laser light, the output of detector 23 can be gated to be unresponsive during the time such direct scattered light from the quenching laser is falling on it. Yet another means to reduce quenching beam photons from reaching detector 23 is to replace dichroic beam splitter 15 with a polarizing beam splitter which reflects plane polarized light from lasers 70 and 71 and transmits the opposite plane of polarization. To the extent that the fluorescent emission is depolarized, it will be able to be partially transmitted through the polarizing beam splitter.

These examples of fluorescent dyes have been discussed principally because they can be excited and quenched with the wavelengths available from Ti-sapphire lasers, which unfortunately have a wavelength gap from about 540 nm to about 680 nm, which is in the region of excitation or quenching of some dyes which otherwise would be good candidates for the present invention. The use of optical parametric oscillators, or lasers able to operate within this wavelength gap of the Ti-sapphire laser, will permit the use of such dyes. A particularly promising class of dye for use in the present invention are the inclusion compounds of the cyclodextrin molecule and various laser dyes occupying its hydrophobic central cavity. The extensive search for laser dyes has found dyes which in many aspect are ideal for the present invention, having a high quantum efficiency, a high stimulated emission cross section and a low ground state absorption at the wavelength of stimulated emission. The use of a cyclodextrin host allows hydrophobic dyes which ordinarily are not suitable for aqueous environments to operate in a hydrophobic microenvironment within an aqueous environment.

The ongoing trend towards increasing miniaturization in integrated circuit design and the fabrication of ultrasmall parts in nanotechnology have placed continuing demands on the resolution of the photolithographic process. Although new technologies, for example using electron beams as the image forming medium, have achieved good lateral resolution, there remains a need to provide similar resolution in the depth dimension. Two-photon excitation can provide depth selectivity (Strickler and Webb, U.S. Pat. No. 5,289, 407 (1994)) but without any improvement in lateral resolution over conventional optical techniques. The present invention offers the hope of a substantial improvement in lateral resolution and, at the same time, good depth selectivity. In photolithography, the initial photochemical event is generally, as in fluorescence, the absorption of a photon, raising a receptor molecule in a photoresist medium to the singlet electronically excited state, this singlet state leading to events resulting in the localized chemical change, for example, in solubility of the photoresist medium. The lifetime of this initial singlet state may be much shorter than in the case of fluorescence, but just as in the examples of the present invention discussed above, this transient singlet state is susceptible to optical quenching by a stimulated emission by a quenching beam tuned to the energy level of the state. Following quenching of the singlet state, the chemical change cannot be triggered. Therefore, for the reasons described above, if the pulsed excitation beam is focused to a diffraction limited spot in the photoresist medium, and immediately thereafter a quenching beam is focused on the photoresist, such that the quenching beam has a central minimum aligned with the central maximum of the excitation beam, the eventual chemical change in the photoresist medium produced by the excitation beam will be localized in a region smaller than the nominal diameter of the central maximum of the excitation beam, improving resolution.

Figure 8:
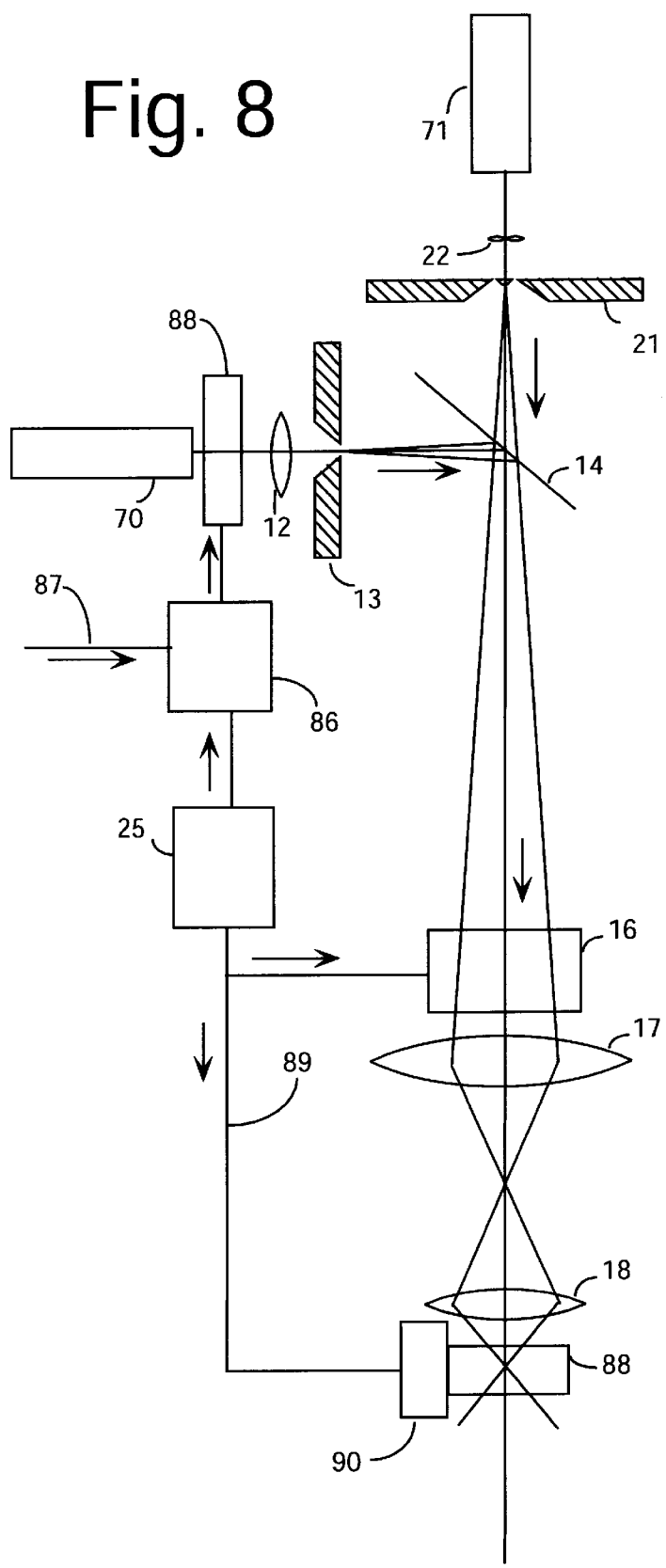
FIG. 8 is a schematic cross-sectional view of an embodiment of the present invention applied to microlithography.

FIG. 8 shows an embodiment of the present invention used in the optical fabrication of very small parts or in microlithography. The excitation laser 70 and the quenching laser 71 are the same as in the embodiment of FIG. 7, and are synchronized as in the embodiment of FIG. 7 so that an ultrashort quenching pulse immediately follows each ultrashort excitation pulse (the synchronizing means such as circuit 73 are not illustrated). Each pulse from laser 70 is modulated by an electrooptical modulator 85 which is the analog converted output of a digital frame memory, the read addresses of which are the digitally converted output of the scan driving circuit 25. By means of data input line 87, a digitally encoded frame is entered into frame memory 86, the frame of which represents the image projected into photolithographic medium 88 which can be a two dimensional layer or a three dimensional block. This embodiment can provide for creation of three dimensional patterns in photolithographic medium, by making digital frame memory 87 adapted to store a series of frames corresponding to the image at different depths, and having the scanning generator circuit 25 also produce an output 89 for scanning the photolithographic medium in depth. Here a motor means 90 is shown for moving the medium 88 in the longitudinal direction to implement such depth scanning. It is interesting to note that the output of the quenching laser 71 is not modulated in the embodiment of FIG. 8. This is because even when there is only a small amount of excitation, exactly the same intensity of the quenching beam is required as for a large amount of excitation. By combining depth selectivity with extremely fine resolution, it is hoped that for applications requiring both of these properties, the present invention may represent an advance over all currently known microlithographic and nanofrabrication methods.

Figure 9:
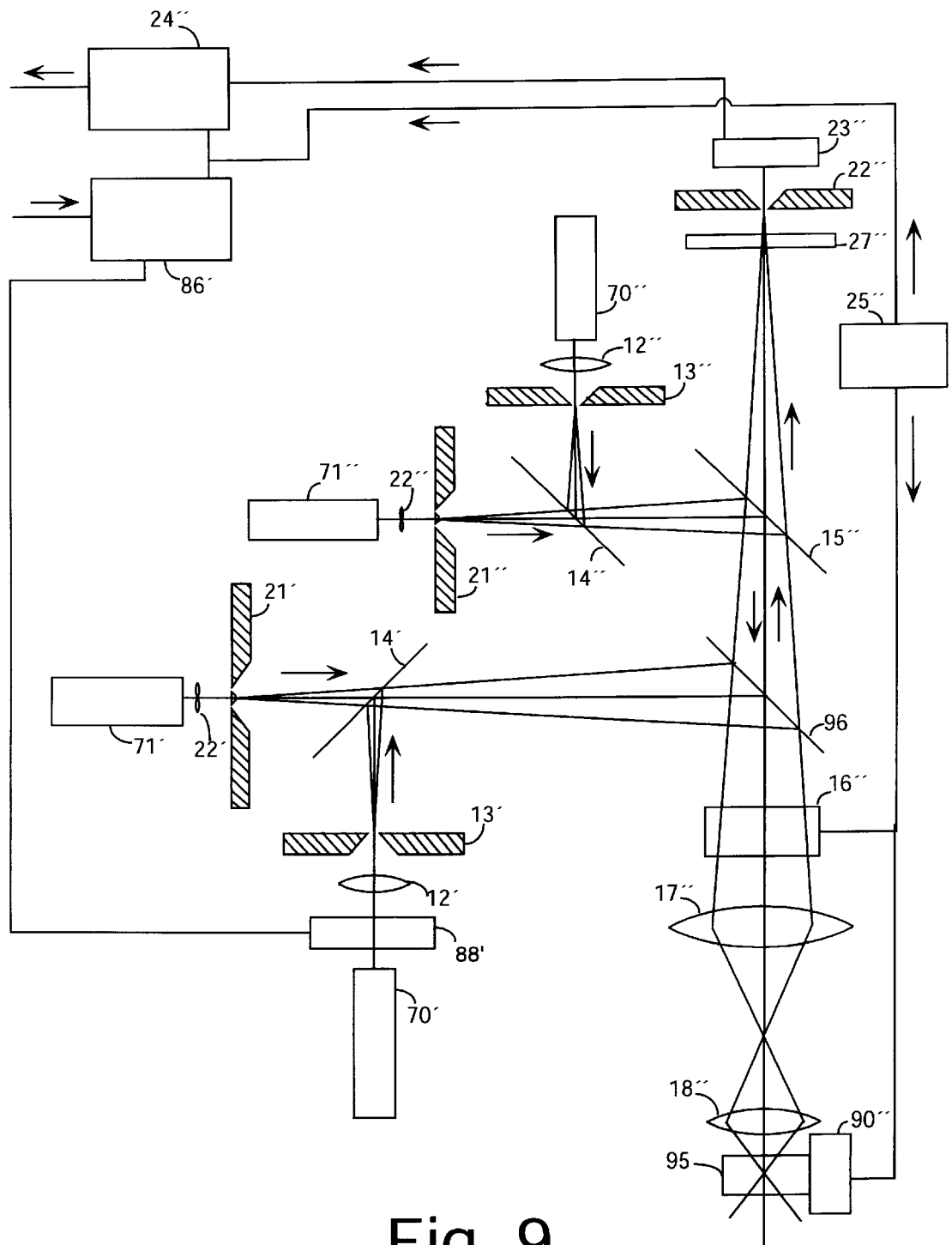
FIG. 9 is a schematic cross-sectional view of an embodiment of the present invention applied to the optical storage and retrieval of information.

FIG. 9 shows the application of the present invention to optical memory storage devices, specifically a WORM (Write Once Read Many) memory device, where, by increasing the resolution of both the writing and the reading beams within this device, the present invention allows a significantly higher information storage capacity than currently known techniques (e.g., Rentzepis, U.S. Pat. No. 5,268,862 (1993), Swainson and Kramer, U.S. Pat. No. 4,471,470 (1984), Denk, et al, U.S. Pat. No. 5,034,613 (1991), Strickler and Webb, U.S. Pat. No. 5,289,407 (1994)). In the memory storage apparatus shown in FIG. 9, the means for writing optical information and the optical recording medium are similar to the microlithographic device of FIG. 8, and corresponding elements are shown by primed numerals. The above text corresponding to FIG. 8 will explain the function of these elements in FIG. 9. The means for reading the stored information in the device of FIG. 9 is similar to the microscopy apparatus of FIG. 7, and corresponding parts are shown by double primed numerals. It will be appreciated that since the parts of the microlithographic apparatus of FIG. 8 itself contains parts analogous to the microscopy apparatus of FIG. 7, that many elements, for example the excitation lasers 70' and 70" are analogous in the writing and reading components of the device of FIG. 9. In practice, it might be possible to switch a single excitation laser from a writing to a reading role by electronically changing its wavelength, but for simplicity the writing and reading components have been represented in FIG. 9 as being entirely separate. A master timing circuit 25" scans the beam from all four lasers 70', 70", 71' and 71", and also synchronizes a writing frame buffer memory 86' and a reading frame buffer memory 24" with the currently scanned point. Scanning of the block of optical storage medium 95 can be in three dimensions, and in such case the longitudinal or "z" axis of scanning is provided by motor means 90". In the device of FIG. 9, the recording medium may be a thick surface layer on a surface of a disc which is rotated to produce scanning in one of the two lateral dimensions.

In the device of FIG. 9, in order to provide for superresolution for both the reading and writing processes, both of these processes involve optical elevation of molecules in medium 95 to a transient excited state which is subject to optical quenching. An example of such a medium is a solid transparent matrix containing a photoactivatable fluorophore, for example, an o-nitrobenzylic derivative of carboxyfluorescein (Molecular Probes, Inc. Eugene, Oreg.), which is non-fluorescent until absorption by the $NO_2$ group of a u.v. photon of a wavelength shorter than about 360 nm., which leads to a chain of events leading to breaking of the molecule into two parts, one of which is the fluorescent dye, carboxyfluorescein (see Strickler and Webb, Proc. SPIE 1398:107 (1990)) Since there is evidence that the initial light induced event in such light activation is a singlet electronically excited state (Yip and Sharma, Research on Chemical Intermediates 11:109 (1989)), it should be possible to quench the excitation by presentation, early in the lifetime of this singlet state, of a pulse of light at the energy of the transition between this excited singlet state to a low vibrational level of the ground state. Thus the writing excitation laser 70' should be tuned to around 350 nm and the writing quenching laser 71' should be tuned to a wavelength around 370 to 400 nm, for example. The reading excitation laser 70" should be set to the absorption maximum of carboxyfluorescein at about 490 nm, and the reading quenching laser 71" should be set to about 525 nm, somewhat redder than the fluorescence emission maximum. The dichroic beam splitter 96 is set to reflect light bluer than about 450 nm and to transmit light redder than this wavelength. It should be appreciated that for any increment in linear resolution due to the use of the present invention in such a device, the increment in memory storage capacity in a three dimensional storage medium will be the third power of such increment. Therefore the present invention might lead to a substantial improvement in the maximum storage capacity of such optical devices.

Another possible application of the present invention is in the optical addressing, study or testing of semiconductor chips with features smaller than the resolution limit of light microscopes presently used for optical beam induced current (OBIC) imaging. In such an application the chip would be coated with a fluorescent sensitizing dye which would be both excited and quenched in spectral regions which are outside the sensitivity range of the semiconductor material of the chip. With just this difference, the apparatus would be used in an identical fashion to present OBIC devices, but at a much greater resolution. Similarly, the present invention could allow submicroscopic optical beam input to nanotechnology devices, such as ultramineature motors.

While in the embodiments of the present invention described in this specification, both excitation and quenching were carried out by focused beams of light, either or both of these roles might be implemented by focused beams of other types of radiation, for example by X-rays, by focused electron or other particle beams or by focused ultrasonic radiation. In the examples given, the radiationally quenchable excited states have been electronically excited states, however any other types of excited state, including nuclear excited states, excited states involving macroscopic quantum structures, molecular isomerizations, or crystal lattice phenomena, for example, would also fall within the scope of the present invention. In the examples given, focusing of the exciting and quenching radiation is provided by lenses, however other devices for focusing are known, including concave mirrors, tapered light pipes and optical fibers, and these can be used for focusing in the present invention. The examples given have considered a specimen or target material with just one radiationally excitable species, however it is often useful in fluorescent microscopy of biological material to employ two or more contrasting fluorescent stains, and the present invention could be used in such applications, for example by chosing two flourophores which have the same excitation and quenching wavelengths but differ in fluorescent lifetimes or emission spectra. All the examples given have employed scanning of a spot or line, but the present invention is also applicable to applications requiring selective illumination of just a single unscanned spot. In the examples given, just one point or line in a specimen is scanned at each moment, however it is possible to simultaneously scan multiple points, with the use of Nipkow discs for example, as in the microscope of Petrăn (U.S. Pat. No. 3,517,980 (1970)) and in such devices, each scanned point is individually subject to the resolution enhancement of the present invention. Thus the scope of the invention should be determined by the appended claims and their legal equivalents, rather than by the examples given.

I claim:

1. In a microscope for imaging a selected region of a specimen which contains a radiationally excitable species, including a source of radiation adapted to excite members of said species and focusing means to focus said radiation to a pattern having a central maximum in said selected region, a method of increasing the resolution of said microscope including the steps of:

providing quenching radiation adapted to radiationally quench the excitation of said members;

shaping said quenching radiation into a pattern with a central minimum, whereby within the central minimum, the intensity of quenching radiation generally increases with distance from the center of the central minimum;

overlapping said central minimum with said central maximum, whereby the center of said central minimum substantially coincides with the center of said central maximum and whereby, within said central minimum, an excited member of said species is quenched by said quenching radiation with an efficiency which generally increases with the distance of said member from the center of said central minimum;

scanning said overlapped central minimum and central maximum relative to said specimen, to successively irradiate different portions of said specimen within said selected region;

measuring radiation emitted by the successively irradiated portions of said specimen, during such scanning; and creating an image of said selected region, each portion of said image having at least one property which depends on the measured radiation emitted by a corresponding irradiated portion of said specimen.

2. The method of claim 1 wherein said quenching radiation is formed into at least one beam having an axis, wherein said axis together with any reflections thereof constitute a generalized axis, and wherein said step shaping said quenching radiation into a pattern with a central minimum includes the additional step of obstructing said quenching radiation at least at one place along said generalized axis.

3. The method of claim 1, wherein said step shaping said quenching radiation into a pattern with a central minimum includes the step of passing said quenching radiation through a plurality of optical fibers, each of said fibers having an exit end where the quenching radiation exits the fiber, such that said exit ends are spaced from an optical axis.

4. The method of claim 1, including the additional step of passing said quenching radiation through said focusing means.

5. The method of claim 1, wherein said exciting radiation is light.

6. The method of claim 1, wherein said quenching radiation is light.

7. The method of claim 1, including the additional steps of delivering said exciting radiation in short pulses and delivering said quenching radiation in short pulses which follow said pulses of exciting radiation.

8. The method of claim 1, wherein said radiationally excitable species is fluorescent and wherein said members are fluorescent molecules.

9. The method of claim 1, wherein said specimen is a recording medium encoding information, and wherein said image consists of electronically represented measurements from portions of said medium.

10. The method of claim 1, wherein said exciting radiation is focused to a pattern substantially consisting of a diffraction limited image of a point.

11. The method of claim 1, wherein said exciting radiation is focused to a pattern substantially consisting of a diffraction limited image of a line segment.

12. The method of claim 1 in which the central maximum, in at least one dimension, has substantially the smallest width achievable by said focusing means focusing said exciting radiation.

13. The method of claim 1, and including an additional step for substantially preventing quenching radiation from being included in the measurement of the radiation emitted by the irradiated portion of said material.

14. The method of claim 13 wherein said measuring step uses a radiation detector and wherein said additional step for substantially preventing quenching radiation from being included in the measurement includes the use of an optical filter substantially opaque to said quenching radiation, said filter being located in the optical path between said specimen and said radiation detector.

15. The method of claim 13 including the additional step of delivering said exciting radiation in short pulses and delivering said quenching radiation in short pulses of quenching radiation which follow said pulses of exciting radiation, and wherein said additional step for substantially preventing quenching radiation from being included in the measurement includes a step of gating the measurement off during said short pulses of quenching radiation.

16. The method of claim 1, wherein said species has an excitation spectrum with at least one band where radiation of a wavelength within said band produces substantially no excitation of said species, and including the step of substantially preventing the quenching radiation from exciting said members by the step of providing the quenching radiation of a wavelength within said band.

17. The method of claim 1 wherein said exciting radiation excites members of said species by a two-photon process and wherein said quenching radiation quenches said members by a one-photon process.

18. The method of claim 1 wherein said focusing means has at least one aperture plane, and includes an annular aperture at said aperture plane.

19. The method of claim 1 wherein said microscope is adapted to simultaneously irradiate a plurality of non-adjacent regions in said target material with exciting radiation, forming in each said region a central maximum of exciting radiation, and for each of said irradiated regions, to direct said quenching radiation so that a central minimum of quenching radiation overlaps with the central maximum in the region, thereby simultaneously improving the resolution in the excitation for each of the irradiated regions.

20. In a microscope for imaging a selected region of a specimen which contains a radiationally excitable species, including a source of radiation adapted to excite members of said species and focusing means to focus said radiation to a pattern having a central maximum in said selected region, means for increasing the resolution of said microscope including:

means for providing quenching radiation adapted to radiationally quench the excitation of said members;

means for shaping said quenching radiation into a pattern with a central minimum, whereby within the central minimum, the intensity of quenching radiation generally increases with distance from the center of the central minimum;

means for overlapping said central minimum with said central maximum, whereby the center of said central minimum substantially coincides with the center of said central maximum and whereby, within said central minimum, an excited member of said species is quenched by said quenching radiation with an efficiency which generally increases with the distance of said member from the center of said central minimum;

means for scanning said overlapped central minimum and central maximum relative to said specimen, to successively irradiate different portions of said specimen within said selected region;

means for measuring radiation emitted by the successively irradiated portions of said specimen during said scanning; and means for creating an image of said selected region, based on such measurements, such that each portion of said image has properties which depend on the measured radiation emitted by a corresponding irradiated portion of said specimen.

21. The microscope of claim 20, and including means for substantially preventing quenching radiation from being included in the measurement of the radiation emitted by the irradiated portion of said specimen.

* * * * *